United States Patent
Katznelson (10) Patent No.: US 6,724,178 B1
(45) Date of Patent: Apr. 20, 2004

(54) MEASURING COMPOSITE DISTORTION USING A COHERENT MULTICARRIER SIGNAL GENERATOR

(75) Inventor: Ron D. Katznelson, San Diego, CA (US)

(73) Assignee: Broadband Innovations, Inc., San Diego, CA (US)

(*) Notice: Subject to any disclaimer, the term of this patent is extended or adjusted under 35 U.S.C. 154(b) by 0 days.

(21) Appl. No.: 09/464,014

(22) Filed: Dec. 15, 1999

(51) Int. Cl.$^7$ ............................................. G01R 23/00
(52) U.S. Cl. .................... 324/76.39; 324/76.19
(58) Field of Search ..................... 324/76.39, 76.13, 324/76.17, 76.19; 348/607

(56) References Cited

U.S. PATENT DOCUMENTS

| | | | | |
|---|---|---|---|---|
| 5,323,239 A | * | 6/1994 | Ward et al. | 348/607 |
| 5,430,799 A | * | 7/1995 | Katznelson | 380/15 |
| 5,481,389 A | * | 1/1996 | Pidgeon et al. | 359/161 |

OTHER PUBLICATIONS

"Composite Triple Beat Distortion", IPS–TP–206, Society of Telecommunication Engineers, Oct. 31, 1997.*
Composite Triple Beat Distortion, IPS–TP–207, Society of Telecommunication Engineers, Oct. 31, 1997.*
E.J. McQuillen and D. Chicks, "CTB/CSO Measurement Repeatability Inprovement Using Uniformly distributed Noncoherent Carrier Frequencies" Proceedings of SCTC Emerging Technologies Conference, Jan. 1998.*
R.D. Katznelson, "TV Modulator Phase Noise Meaningful Performance Criteria, Specification and new Measurement Methods" NCTA Conference, Atlanta, May 1998.*

* cited by examiner

*Primary Examiner*—Safet Metjahic
*Assistant Examiner*—T. R. Sundaram
(74) *Attorney, Agent, or Firm*—Robert C. Strawbrich (57) ABSTRACT

A method for measuring composite distortion levels using a coherent multicarrier RF signal generator having incrementally related frequencies is disclosed. The invention provides for the use of a coherent multicarrier signal generator that permits arbitrary RF carrier phase control on an individual carrier basis in order to enable sequential distortion measurements under varying carrier phase conditions. In order to obtain measurement results that match those obtained by the use of prior art non-coherent signal sources, the present invention provides for averaging of distortion measurement results over a 'phase configuration ensemble' that is obtained by multiple sequential measurements, in which the individual carrier phases for each measurement are preselected at random. The advantages afforded by the invention in comparison with prior art methods are improved repeatability and accuracy, reduction of the required measurement resolution bandwidths (from 30 kHz to as low as 30 Hz) thereby the reduction of noise levels by 30 dB. This feature greatly improves the measurement system's dynamic range and permits the elimination of overload protection preselector filters that are commonly used in prior art non-coherent measurement systems.

7 Claims, 10 Drawing Sheets

CTB Distortion with a first phase configuration

Figure 1. Location of Distortion Terms

Figure 2 Typical Test Configuration for Distortion Measurements using the Invention Figure 3 CTB Distortion with a first phase configuration Figure 4. CTB Distortion with a second Carrier Phase configuration Figure 5 Distortion terms using non-coherent MCG (top) vs. those with coherent MCG (bottom)

Figure 6 Non-coherent MCG often requires a preselector filter (top) while low phase noise coherent source permits its removal (bottom).

Figure 7. CTB Measurement on Channel 13

Figure 8. CSO Measurement on Channel 13

Figure 9. Averaging Utility User Interface

Figure 10. Averaged CTB Distortion

MEASURING COMPOSITE DISTORTION USING A COHERENT MULTICARRIER SIGNAL GENERATOR

BACKGROUND OF THE INVENTION AND THE PRIOR ART

Distortion performance of RF components subjected to broadband multichannel signal inputs are often measured by using a Multicarrier Generator ("MCG") as a signal source. The measurement practice typically involves feeding the MCG's composite signal to a Device Under Test ("DUT") and observing its output signal with a spectrum analyzer in a way that permits the observation and measurement of additional spectral components that are generated due to nonlinear distortions of the DUT. Of particular importance are measurements of broadband active devices' second and third order distortion components. These are called the Composite Second Order ("CSO") and Composite Triple Beat ("CTB") distortion components.

Prior art practices for measuring these distortion components using non-coherent MCG are described in detail in measurement standards adopted by the Society of Cable Telecommunications Engineers ("SCTE") and are available as documents entitled "*Composite Triple Beat Distortion*", IPS-TP-206, SCTE (Oct. 31, 1997) and "*Composite Second Order Distortion*", IPS-TP-207, SCTE (Oct. 31, 1997). These practices are designed to provide with distortion measurement methods that can closely predict actual performance of active devices in cable TV systems.

Most cable systems and some MCGs that emulate cable systems are non-coherent systems in which individual carrier frequencies are not rigidly related to each other and may each independently vary over a frequency range of hundreds or thousands of Hertz relative to their nominal frequency setting. When the carriers are unmodulated in such non-coherent systems, specific distortion components (CTB or CSO on any particular channel) constitute narrow-band signals that may each consist of hundreds or even thousands of distortion signal terms spread out in frequency over several kHz. This necessitates the setting of the Spectrum Analyzers' Resolution Bandwidth ("RBW") to 30 kHz and performing video filtering with a low video bandwidth (10 Hz or 30 Hz), and video averaging if possible.

It is important to note that both video filtering and video averaging applied in such measurements essentially amount to time-averaging of the output of the spectrum analyzer's LOG amplifier which is fed by its IF envelope detector. Hence, the practice in the industry is to report the average of decibel values of the fluctuating distortion power rather than its average power in decibels. It can be shown mathematically that absent such time averaging (i.e. video bandwidths settings that exceed the RBW), the first order probability density function of such measured results is a Log-Rayleigh distribution and that the variance is approximately 5.6 dB, independent of the absolute levels, the channel or even the order of the distortion term.

The results under video filtering conditions depend on many factors including the spectral distribution of the distortion signals. In this context, if the distortion power spectra does indeed fall well within the 30 kHz RBW, and at the same time has a smooth spectral characteristics devoid of pronounced power variations over a frequency scale of less than the video filter bandwidth, then one can obtain a reasonably accurate and stable measurement of the average distortion power.

Typically however, the fine structure of the spectral distribution of distortion terms is unknown and may vary from one instance to another which may result in loss of both the accuracy and repeatability of the measurement. If distortion terms fall outside of the analyzer RBW setting, the analyzer will consistently underestimate the true distortion power. Alternatively, if a significant portion of the distortion power spectrum has pronounced spectral power variations over a frequency range smaller than the video filter bandwidth, then distortion measurements will not be repeatable as a consequence of insufficient video averaging of very slow fluctuations. Ironically, this phenomena of slow fluctuation in the averaged distortion power is more pronounced with improved frequency precision of the non-coherent carriers, as the distortion components are dispersed over a narrower bandwidth, giving rise to large spectral power variations over a narrower frequency range.

The slow fluctuation and lack of repeatability of these distortion measurements was recognized and prior art methods attempting to mitigate it have been reported in a conference paper entitled "*CTB/CSO Measurement Repeatability Improvements Using Uniformly Distributed Noncoherent Carrier Frequencies*", by E. J. McQuillen and D. Schick, published in the Proceedings of the SCTE Emerging Technologies Conference, pp 315–328; San Antonio, Jan. 28–30, (1998). These authors proposed a "Pseudorandom Spreading" method of intentionally dispersing the actual frequencies of all the carriers by pseudorandom frequency deviations of up to a few kHz so that the resulting distortion components would appear spread out over a frequency range that is up to three times wider than that, thereby reducing the likelihood of slow distortion envelope fluctuations.

One of the difficulties with such a "Pseudorandom Spreading" method is that by its very nature, it spreads out the distortion spectra away from the center of the Resolution Bandwidth Filter. The 30 kHz RBW filter mode used in the spectrum analyzer has a 3 dB bandwidth of 30 kHz, which means that a frequency response loss of 1–2 dB can easily be incurred for these dispersed distortion components. This factor can cause a systematic error by underestimating the distortion power. Indeed, the above referenced paper's authors themselves report without any explanation a measurement bias of 2 dB as compared to the non-dispersed case. Furthermore, the actual bias depends on the specific tone that is being measured and the specific collection of terms and their respective frequency deviations from the center of the filter. Alternatively, Expanding the RBW might reduce this bias but it will be at the expense of noise immunity.

In other approaches, prior art use of coherent sources for distortion tests was also made but for the reasons discussed below was often met with significant inconsistencies and deviations from expected results. One type of a coherent MCG source differs from non-coherent head-ends and simulators in that it generates an Incrementally Related Coherent ("IRC") multicarrier signal. The multicarrier signal is generated in accordance with an IRC frequency plan in which carrier frequencies $f_n$ are given by the following formula:

$$f_n = n \cdot 6 \text{ MHz} + 1.2625 \text{ MHz},$$

where n represents the carrier index. Thus, carriers are spaced by 6 MHz and fall at offsets of 1.2625 MHz relative to 6 MHz multiples. For test purposes, an MCG in which n takes on values between 9 and 135 is preferable. All carriers generated by such coherent source are locked to a common signal reference. Small deviations in the reference frequency will result in small deviations in the carrier spacing and offset. However, these deviations will be scaled for all channels with the same scale factor. Thus, all channels will still be spaced by exactly a common frequency spacing and will be located at the same fixed frequency offset relative to multiples of the carrier frequency spacing. The coherent MCG can be based, for example, on the apparatus which can generate a plurality of IRC signals with very low phase noise as described in U.S. Pat. No. 5,430,799 issued to the present inventor (hereinafter termed as the "'799 Patent").

When an MCG with very low integrated phase noise is driving the DUT, the output distortion products (CTB or CSO) on a particular channel generated by the nonlinear DUT subject to the unmodulated coherent multicarrier signal are CW signals having constant amplitudes that fall exactly on the channel frequency or exactly at offsets that are integer multiples of ±1.2625 MHz from the channel frequency. For a particular distortion product, one can picture the hundreds or thousands of distortion terms generated by a non-coherent system converging to a single frequency term as the carrier frequency spacing between all carriers converges to a constant common value.

Figure 1:
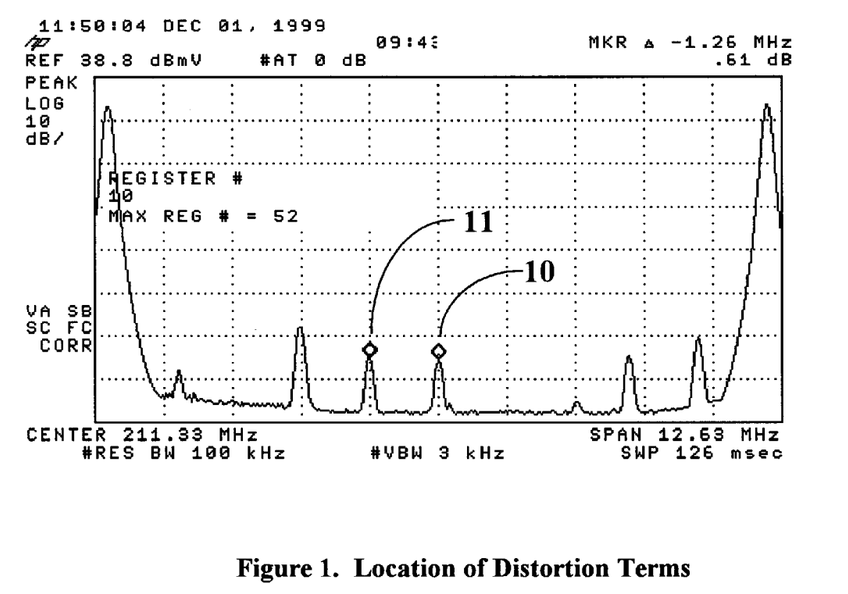
FIG. 1 illustrates the location of distortion terms relative to carrier frequencies captured in a spectrum analyzer trace.

Reference is now made to FIG. 1 which is a captured spectrum analyzer trace. It illustrates the frequency location of distortion terms relative to the carrier frequencies in a broadband nonlinear device (which was slightly overdriven for illustration purposes). Here, the carrier of a particular test channel at the center of the scale, was turned off while all other channels are left at full power. The primary marker 10 is located at the on-channel CTB term and the delta marker 11 is on a CSO term that falls 1.2625 MHz below the channel center frequency. With a coherent MCG is used, the amplitude of the CW distortion terms discussed above are functions of the relative phases of all (coherent) distortion components, which in turn depend on the specific carrier phases of the composite multicarrier signal. It is important to note that for a given carrier phase configuration, non-fluctuating constant amplitudes of these distortion terms are only encountered if the total integrated phase noise of the carriers is very low. The direct digital synthesis technology disclosed in the '799 Patent provides such stability based on its total integrated phase noise specification of less than one degree.

In contrast, many so called 'coherent sources' have been found to be frequency locked but fail to maintain rigid phase positions due to their inherent integrated phase noise that can easily produce phase fluctuations in excess of 60 or even 100 degrees (See "*TV Modulator Phase Noise Meaningful Performance Criteria, Specification and New Measurement Methods*" by Ron D. Katznelson, NCTA Technical Conference, Atlanta; May 4, 1998). Unfortunately, these types of 'coherent' sources were the basis for much of the industry's past experience with coherent sources, when the relative phase distribution of the carriers was never ascertained, verified or much less controlled. As a result, the use of these 'coherent' sources often produced measurement results that were less predictable and often have had significant deviations from those obtained with non-coherent sources. Therefore, it is the object of the present invention to provide for a method and an apparatus which improves the repeatability and the stability of multicarrier distortion measurements. Another object of the present invention is to provide for a method and an apparatus for accurate and unbiased measurement of distortion terms in multicarrier signal environments. Still another object of the present invention is to provide for a method and an apparatus for multicarrier distortion measurements that use reduced measurement resolution bandwidth, thereby mitigating noise contamination and improving dynamic range of such measurements.

DETAILED DESCRIPTION OF THE INVENTION AND ITS PREFERRED EMBODIMENT

Figure 2:
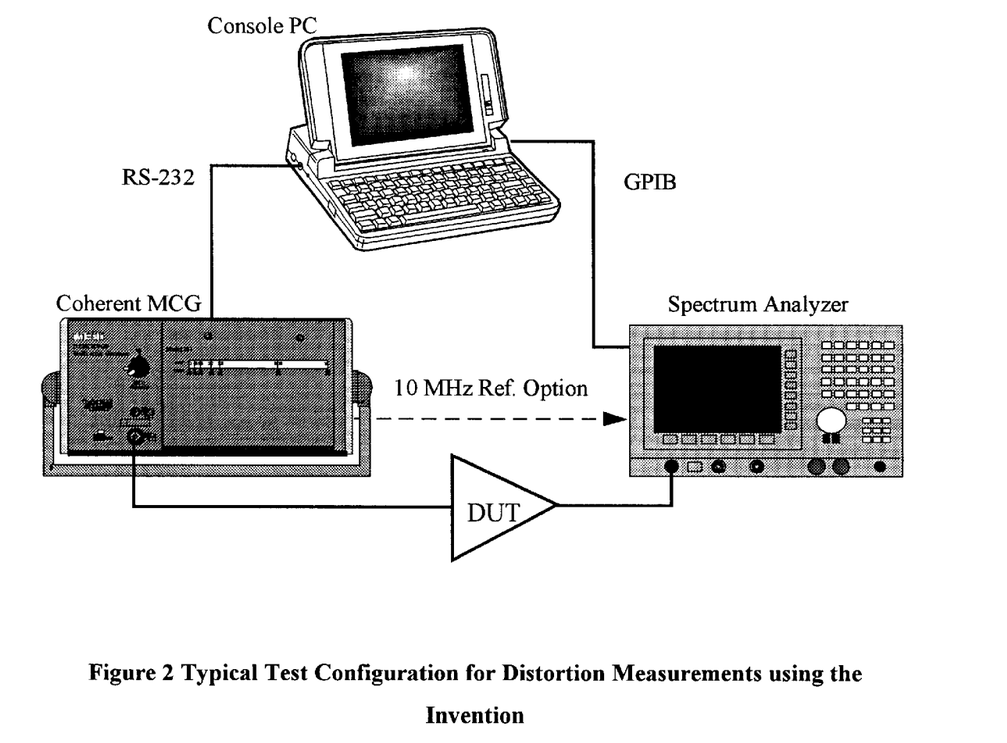
FIG. 2 illustrates a measurement set-up in accordance with one embodiment of the invention.
Figure 3:
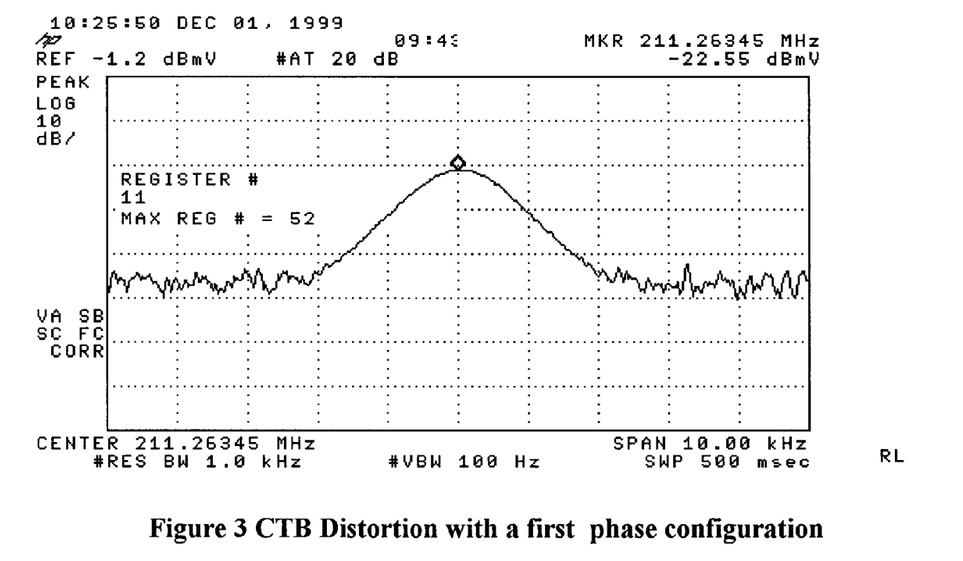
FIG. 3 illustrates a measurement made in accordance with the present invention for a first carrier phase configuration.
Figure 4:
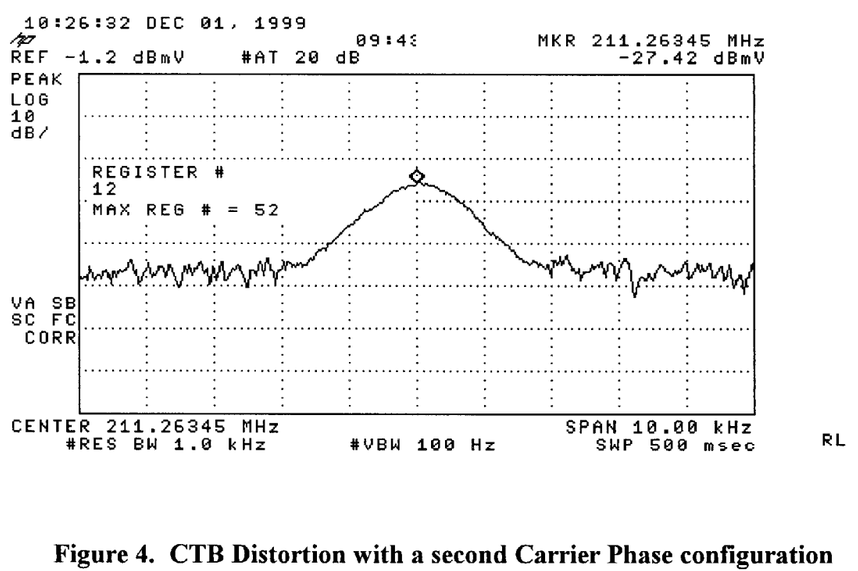
FIG. 4 illustrates a measurement made in accordance with the present invention for a second carrier phase configuration.
Figure 5:
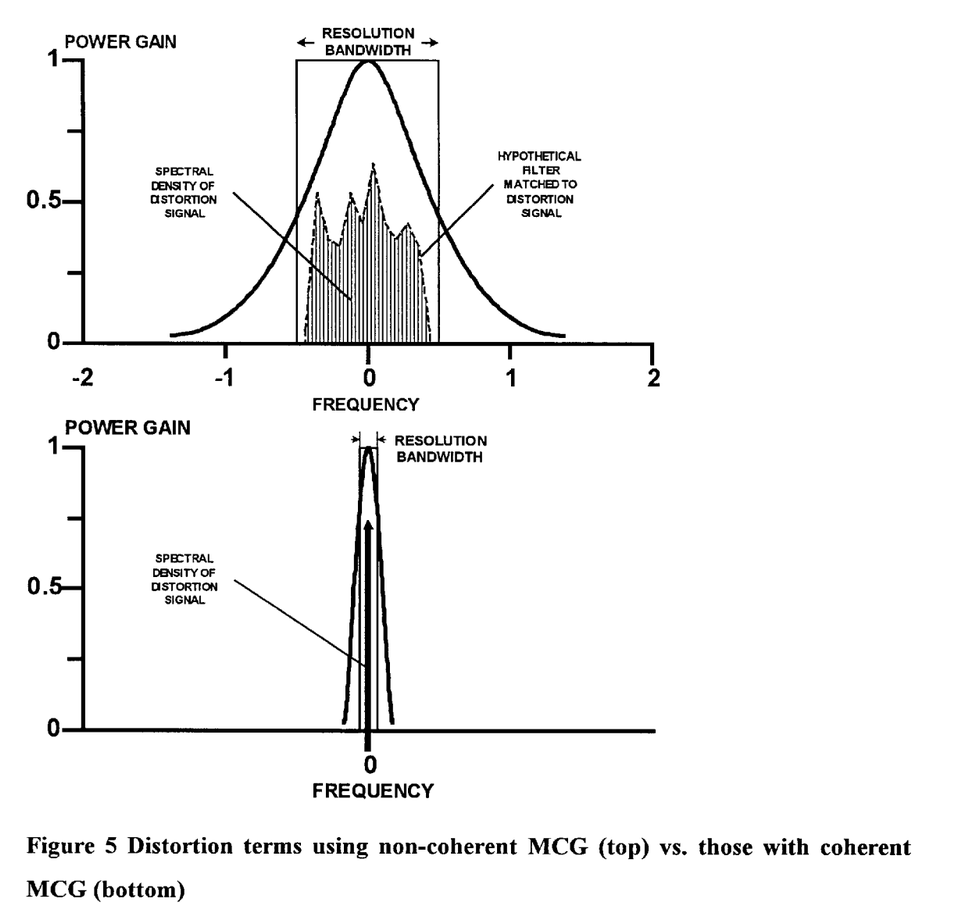
FIG. 5 illustrates the effect on distortion terms of reducing the resolution bandwidth.

The present invention utilizes a coherent MCG with ultra low phase noise and with affirmative phase control for each carrier over an ensemble of carrier phase configurations. The techniques for generating multicarriers wherein specific phase control for each carrier can be effected have been disclosed in the '799 Patent. The measurement setup in accordance with the invention is shown in FIG. 2. Phase configuration control is effected by the PC console controlling the Phase Controlled MCG. The PC Console also controls the spectrum analyzer via the GPIB bus line. Focusing now on a specific distortion term, FIG. 3 and FIG. 4 depict two measurements of on-channel CTB distortion using an apparatus of the present invention. The two measurements were obtained under different carrier phase configurations. There are several items worth emphasizing in these figures:

Note the low RBW setting. The distortion terms are indeed CW terms that permit the reduction in resolution bandwidth, now limited only by the capability of the Spectrum Analyzer and its relative frequency stability. The effect of reducing the resolution bandwidth is illustrated in FIG. 5.

Figure 6:
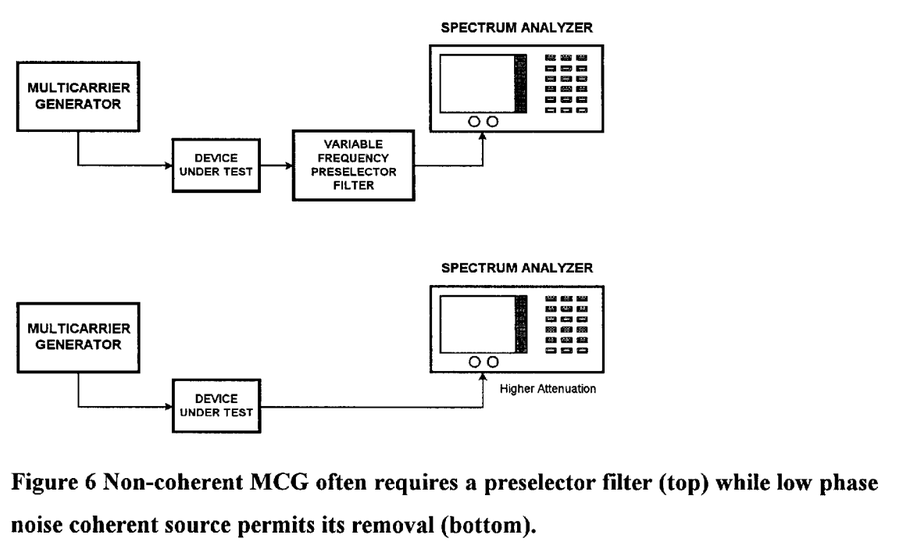
FIG. 6 illustrates the advantage of using a low-phase noise coherent multicarrier signal generator (MCG) versus a non-coherent MCG.

As a consequence of the low RBW settings, the noise contamination of the distortion measurements is mitigated. Distortion measurements using non-coherent generators may require spectrum analyzer RBW settings of 30 kHz or more, thereby requiring lower input attenuation setting in the Spectrum Analyzer. This attenuation setting in turn limits the dynamic range of the measurement compared to that possible with the Phase Controlled Coherent MCG. These advantages are illustrated in FIG. 6.

Even though there is no change in the power level of each of the carriers, the amplitude of the CW distortion term differs based on the individual carrier phase settings.

As noted above, the amplitude of the distortion terms generated by the Phase Controlled Coherent MCG has been shown to vary with the phases of the various carriers that comprise the multicarrier RF output. In order to use the coherent MCG to perform average distortion measurements in accordance with the invention, we shall now relate the amplitudes of distortion measurements obtained with such coherent MCG to the time average of distortion that would be generated by a non-coherent MCG.

It can be shown that multicarrier generators that are truly non-coherent have carrier frequencies that are linearly independent over the rational numbers. That is, their carrier frequencies cannot be related to each other through any rational coefficients. In this case, it is can be shown based on Kronecker-Weyle theorem that time averages of distortion values over sufficiently long time intervals are equal to 'phase ensemble' averages of distortion values when the frequencies are coherent and where averaging is performed over all phases of the coherent carriers. Thus, averaging over a sufficient number of RF carrier configurations having different carrier phases (the 'ensemble') in carrier phase controlled coherent generator can replace time averaging of non-coherent generators.

An imprecise but intuitive notion of the foregoing property can be stated as follows: Over time intervals that are long enough and contain many cycles of the carrier separation frequency (6 MHz) but short enough compared to the period derived from the inverse of the largest carrier frequency deviation from the nominal frequency grid (hundreds of Hz), a non-coherent multicarrier signal can be well approximated by a coherent multicarrier signal operating on the nominal frequencies with particular carrier phases. Thus, the distortion generated by a coherent MCG with particular carrier phases can be interpreted as a specific instantaneous snapshot of the distortion that would otherwise be generated by a non-coherent generator having the same carrier levels. Introduction of phase configuration ensemble in the coherent case is equivalent to providing many such 'snapshots' that are at time intervals that are sufficiently far apart in the non-coherent case.

These results imply that a distortion measurement obtained using a coherent MCG with one particular set of carrier phases will not necessarily provide results representative of the average distortion power resulting from a non-coherent multi-carrier signal. If one draws phase configurations at random, the expected value of such measurement is indeed equal to the average distortion power that would result from time averaged measurement of a non-coherent generator; however, as noted above, the standard deviation of such a measurement is $\sigma=5.6$ dB. Thus, with one particular realization of carrier phases it is unlikely that a single measurement using a coherent generator will provide results representative of the time average distortion power resulting from a non-coherent generator.

Hence, to achieve averages over the 'phase configuration ensemble' as required, we make multiple sequential measurements, in which the individual carrier phases for each measurement are preselected at random. We can then estimate the average distortion $\overline{D}$ (in dB) that would result from a non-coherent multi-carrier signal by calculating the sample mean over multiple measurements of distortion values $D_i$ (in dB) obtained with coherent signals with these different carrier phase configurations:

$$\overline{D} = \frac{1}{N}\sum_{i=1}^{N} D_i$$

It should be noted that averaging the decibel values of the power over the ensemble is in conformance with the industry practice of averaging of LOG of power values since it is the equivalent counterpart of using video filtering (averaging) over time. For each channel over which we obtain such distortion measure, the sample mean $\overline{D}$ is itself a random variable depending on the ensemble, with an expected value equal to the average distortion resulting from a non-coherent signal, and a standard deviation $\sigma_N$. Because the phase settings of the phase configuration ensemble are statistically independent, the standard deviation of this sample mean would be given by $$\sigma_N = \frac{\sigma}{\sqrt{N}}$$

where N is equal to the number of measurements in the ensemble. For N=20, the standard deviation is 1.25 dB, which represents an error that is often smaller than that due to the spectrum analyzer power level inaccuracy or even due to the variations that would typically be encountered in time average measurements of non-coherent sources.

It is important to note that measurements obtained using the present invention with the Phase Controlled Coherent MCG are completely repeatable, since they are entirely a function of the ensemble of carrier phase configurations, which can be explicitly controlled. This repeatability characteristic represents a significant improvement over non-coherent generators, in which repeatability is contingent on the relative frequency distribution of the distortion terms, which is difficult to control.

Finally, it is also important to note that, while ensemble averaging may be required for obtaining average distortion measures, the Phase Controlled Coherent MCG can provide excellent insight and utility by only using any single phase configuration it contains. A single realization from the ensemble can provide a steady and repeatable measure for specific A-B improvement tests (discerning even fractions of a dB) while evaluating specific changes in active devices during their development. The variances in the measured results under this condition are negligible and are only dependent on thermal noise effects. Typically, this type of engineering development measurement capability is practically unavailable with non-coherent sources, as they fail to provide any repeatability down to the fraction of a dB in any reasonable time frame.

Averaging Distortion over Multiple Phase Configurations

We noted previously that multiple measurements are performed over an ensemble of carrier phase configurations. These are realized by presenting multiple coherent multi-carrier signals having the same power profile for all of the carriers; however, the specific phases of the individual carriers differ across presentations.

The Phase Controlled Coherent MCG includes 20 unique phase configurations. Each phase configuration represents a particular set of carrier phases. The many phases (one for each carrier) associated with any one of the particular phase configuration have been drawn at random and stored; hence the phase configurations are statistically independent. These configurations have also been preselected for having generally unbiased characteristics.

The PC Console includes an RF Phase Configuration control panel. The RF Phase Configuration control panel allows an operator to manually select any of the 20 phase configurations. The control also includes an Auto-play feature that cycles through all 20 phase configurations. The dwell-time (the amount of time that each configuration is played) may be programmed by the operator. In addition, an automatic synchronization with a spectrum analyzer measurement is provided (Sync mode) for automated average acquisition procedures.

Also in the PC Console are the individual carrier power controls for each channel and other features related to carrier modulation modes. The selection of the test channels over which measurements can be made is also provided.

An optional 10 MHz Reference Lock signal from the Phase Controlled Coherent MCG is also shown in FIG. 2 with a broken line. It can be used to lock the spectrum analyzer frequency reference to that of the Generator. This will permit a precision frequency match between the Generator and the spectrum analyzer, which enables reduction of the analyzer's RBW to 30 Hz, without concerns of frequency drift. This corresponds to three orders of magnitude reduction of the RBW (30 dB dynamic range advantage in measurement) as compared to that used in non-coherent MCGs. In the following paragraphs, however, the instrument settings including the RBW are less aggressive and are based on not having this Reference Lock option.

The following procedure is a manual averaging procedure that can be used to learn the behavior of the instruments and the averaging process. It is expected, however, that distortion measurements would normally be done automatically as explained below. The manual procedure should proceed as follows:

1. Configure the Phase Controlled Coherent MCG for the desired test channel and for phase configuration #1. In this example the PC Console is configured to perform measurements on channel 13.
2. Configure the spectrum analyzer to perform measurements of the desired distortion term.

Figure 7:
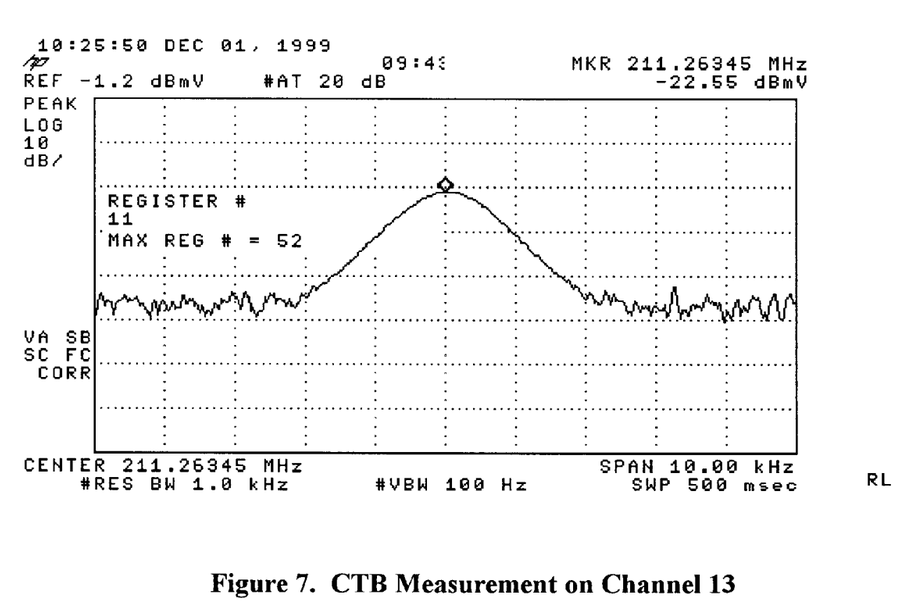
FIG. 7 illustrates a spectrum analyzer configured to perform on-channel CTB measurements on channel 13 (center frequency of 211.2625 MHz).

FIG. 7 depicts the spectrum analyzer configured to perform on-channel CTB measurements on channel 13 (center frequency of 211.2625 MHz).

Figure 8:
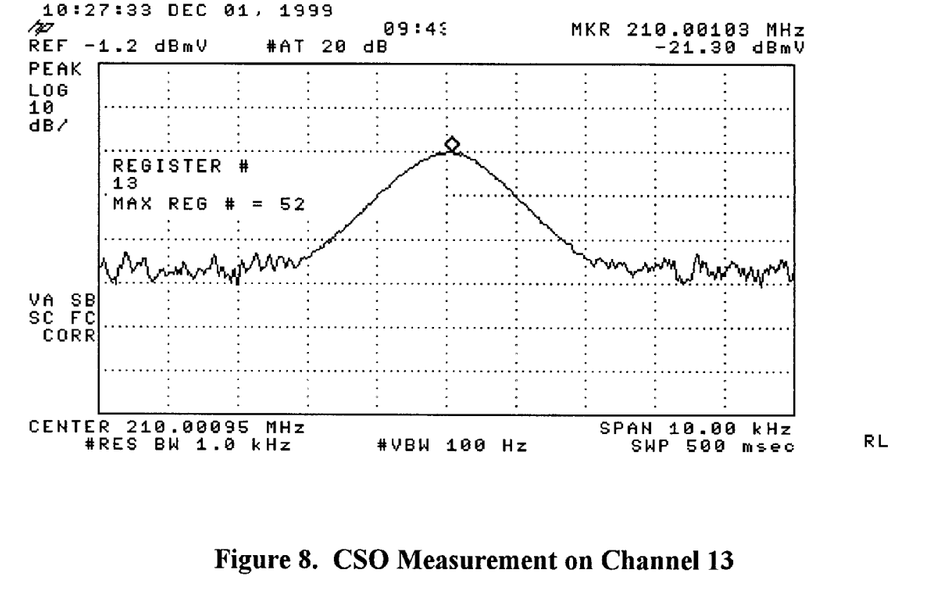
FIG. 8 illustrates a spectrum analyzer configured to measure low-side CSO on channel 13.

FIG. 8 depicts the spectrum analyzer configured to measure low-side CSO on channel 13. Note that the center frequency is exactly 1.2625 MHz below the center frequency of the CTB measurement. Recall that the CW nature of Benchtop distortion terms makes it possible to perform narrow-span, low RBW measurements of distortion. In this particular example, the spectrum analyzer is configured as follows:

Span: 10 kHz; RBW: 1 kHz; VBW: 100 Hz

3. Obtain an absolute distortion measurement $D_1$ in dB by performing a peak search.
4. Repeat steps 1 and 3 for phase profiles 2–20.
5. Calculate the average distortion power $\overline{D}$ in dB by dividing the sum of all measurements $D_i$ (given in dB) by the number of measurements:

$$\overline{D} = \frac{1}{20}\sum_{i=1}^{20} D_i.$$

Automated Trace Averaging across Phase Configurations

In order to facilitate the averaging of distortion terms across phase configurations, Phase Controlled Coherent MCG is controlled by the PC Console which includes an utility that synchronizes spectrum analyzer trace captures to phase configuration changes, averages the captured traces, and writes the averaged traces back to the spectrum analyzer. Thus, if N phase configuration changes have taken place, the analyzer display will show distortion averaged over these N phase configurations. The utility presently supports HP 859X and HP 856X series spectrum analyzers.

Figure 9:
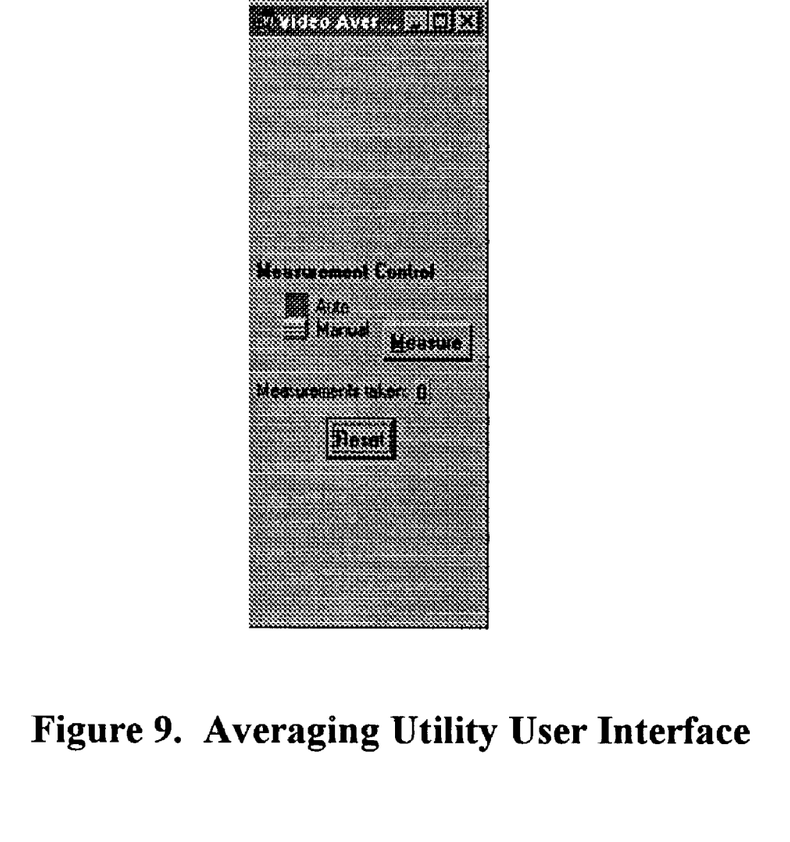
FIG. 9 illustrates one embodiment of a user interface.

The automated trace averaging utility is a stand-alone application that executes at the same time as the Benchtop console application. The utility is invoked from the Windows desktop. The averaging utility user interface is illustrated in FIG. 9.

The utility supports both an automated mode of operation and a manual mode of operation. In automated mode, spectrum analyzer trace captures are synchronized to phase configuration changes. In manual mode, spectrum analyzer trace captures are enabled by clicking on the 'Measure' control.

The 'Measurements taken:' indicator reports the number of trace captures that have taken place (and hence the number of measurements over which the average is performed).

The 'Reset' control resets both the 'running' average trace to zero and the 'Measurements taken' indicator to zero.

The averaging utility operates on spectrum analyzer trace elements. For example, the HP 859X series analyzers implement 401 display trace elements. An averaged trace consists of 401 separately averaged trace elements. For each trace element, averaging is performed in accordance with the following formula:

$$\overline{D}_N = 1/N[(N-1)\overline{D}_{N-1}+D_N]; \text{ where } \overline{D}_0 = 0 \text{ by definition,}$$

and where $D_N$ is the raw distortion measurement obtained at the $N^{th}$ measurement step, and $\overline{D}_N$ is the running average of the distortion obtained at that step. This 'running' average is equivalent to summing each measurement (of a particular trace element) and dividing by the number of measurements.

The following procedure illustrates how the automated averaging utility would be used to perform the CTB measurement described in the previous section.

1. Configure the Phase Controlled Coherent MCG for the desired test channel and for phase configuration #1.
2. Set the "Dwell Time" in the "Autoplay" section to "Sync".
3. Configure the spectrum analyzer to perform measurements of the desired distortion term. (See FIG. 7).
4. Activate the Reset control at the averaging utility user interface. (See FIG. 9).
5. Activate the Start control at the RF Phase Configuration control panel of the PC Console.
6. The Phase Controlled Coherent MCG will proceed to cycle through the RF phase configurations. After each phase configuration is activated, the measuring utility will capture the measured trace, update the averaged trace, and write the averaged trace back to the spectrum analyzer. Thus, the spectrum analyzer always displays the latest averaged trace.
7. At the conclusion of the phase configuration Autoplay process, the analyzer trace will represent CTB distortion averaged over 20 phase configurations. At this point, the analyzer can be placed in local control mode, and the marker and/or peak search functions can be used to measure the average distortion power.

Figure 10:
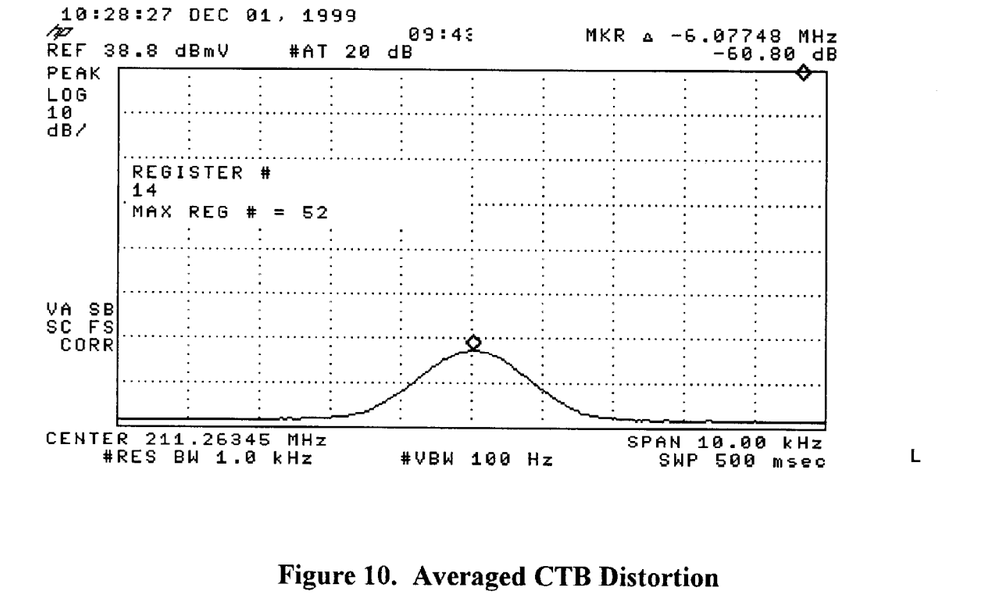
FIG. 10 illustrates a spectrum analyzer trace representing the average over 20 phase configurations.

FIG. 10 illustrates the spectrum analyzer trace representing the average over 20 phase configurations. In this particular illustration, a reference marker was placed at the peak of the adjacent carrier (channel 23) prior to beginning the measurement process and the analyzer was placed in marker delta mode. Then, without changing the center frequency, the spectrum analyzer was configured as shown in FIG. 7 (and FIG. 10). At the conclusion of 20 averaging measurements, the marker was placed at the distortion peak and the analyzer displays distortion in dBc (−60.8 dBc in this example).

SUMMARY

This application note discusses how CTB and CSO distortion measurements are performed using the present invention. The technique of averaging distortion over multiple phase configurations is described, and examples of both manual and automated averaging techniques are presented. The measurement advantages provided by present invention can be summarized as follows:

Repeatable and accurate distortion measurement using preselected stored phase configuration ensembles.

Precise and fast A-B comparison tests are possible with one phase configuration, permitting higher sensitivity tests for engineering improvements in active devices.

Up to 30 dB dynamic range improvements in distortion measurements by using reduced resolution bandwidth.

Ability to eliminate the need of preselector filters at the input of the spectrum analyzer.

What is claimed is:

1. A method for measuring a composite distortion component, said method comprising the steps of:

feeding a non-linear device with a coherent multicarrier signal generator having individual carrier phase control;

sequentially setting a plurality of random carrier phase values for the individual carriers to form an ensemble of carrier phase configurations of said coherent multicarrier signal generator;

sequentially measuring the level of said composite distortion component in each realization of said ensemble of carrier phase configurations thereby obtaining samples of distortion measures; and averaging said samples of distortion measures, wherein said averaging is over said ensemble of carrier phase configurations thereby obtaining an ensemble average composite distortion measure.

2. The method of claim 1 wherein said plurality of random carrier phase values are statistically independent.

3. The method of claim 1 wherein a frequency selective signal level measurement device is used for the step of sequentially obtaining said samples of distortion measures and wherein the resolution bandwidth of said frequency selective signal level measurement device is substantially less than 30 kHz.

4. The method of claim 3 wherein said frequency selective signal level measurement device is a spectrum analyzer.

5. A method for measuring a composite distortion component, said method comprising the steps of:

feeding a non-linear device with a coherent multicarrier signal generator;

using spectrum analyzer to measure the level of said composite distortion component;

connecting the output of said non-linear device to the input of said spectrum analyzer without the use of an overload protection preselector filter; and employing a resolution bandwidth for said spectrum analyzer that is substantially less than 30 kHz during the measurement.

6. The method of claim 5 wherein said resolution bandwidth is 30 Hz.

7. The method of claim 5 wherein frequency references of the spectrum analyzer and of the coherent multicarrier signal generator are frequency locked.

* * * * *